United States Patent
Das et al.

(10) Patent No.: US 7,321,980 B2
(45) Date of Patent: Jan. 22, 2008

(54) SOFTWARE POWER CONTROL OF CIRCUIT MODULES IN A SHARED AND DISTRIBUTED DMA SYSTEM

(75) Inventors: Subrangshu Kumar Das, West Bengal (IN); Ashutosh Tiwari, Chattisgargh (IN); Subash Chandar Govindarajan, Tamil Nadu (IN); Karthikeyan Rajan Madathil, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 448 days.

(21) Appl. No.: 11/035,216

(22) Filed: Jan. 13, 2005

(65) Prior Publication Data

US 2005/0180233 A1 Aug. 18, 2005

Related U.S. Application Data

(60) Provisional application No. 60/536,200, filed on Jan. 13, 2004.

(51) Int. Cl.
*G06F 1/04* (2006.01)
*G06F 1/12* (2006.01)
*G06F 5/06* (2006.01)

(52) U.S. Cl. .................... 713/601; 713/600; 365/202

(58) Field of Classification Search ............... 713/600, 713/601; 365/202
See application file for complete search history.

(56) References Cited

U.S. PATENT DOCUMENTS

| | | | | |
|---|---|---|---|---|
| 4,513,378 | A * | 4/1985 | Antkowiak | 701/217 |
| 6,298,394 | B1 * | 10/2001 | Edwards et al. | 710/15 |
| 2003/0005278 | A1 * | 1/2003 | Deng et al. | 713/2 |
| 2004/0250147 | A1 * | 12/2004 | Chang | 713/323 |
| 2006/0179329 | A1 * | 8/2006 | Terechko et al. | 713/300 |

* cited by examiner

*Primary Examiner*—Thomas Lee
*Assistant Examiner*—Jaweed A Abbaszadeh
(74) *Attorney, Agent, or Firm*—Robert D. Marshall, Jr.; W. James Brady; Frederick J. Telecky, Jr.

(57) ABSTRACT

A system-on-chip integrated circuit selectively gates clocks to individual modules corresponding to the state of a corresponding bit of a peripheral enable register. A reset circuit supplies a signal to a reset input of the digital module for a normal mode if the bit indicates the power-up state and a reset mode if the bit indicates a power-down state. Return to normal mode is delayed a predetermined time after the said bit of indicates the power-up state to ensure clean power up. A false acknowledge circuit for each module supplies an acknowledge signal in response to a received command if the corresponding bit indicates the power-down state.

6 Claims, 2 Drawing Sheets

SOFTWARE POWER CONTROL OF CIRCUIT MODULES IN A SHARED AND DISTRIBUTED DMA SYSTEM

CLAIM OF PRIORITY

This application claims priority under 35 U.S.C. 119(e)(1) from U.S. Provisional Application 60/536,200 filed Jan. 13, 2004.

TECHNICAL FIELD OF THE INVENTION

The technical field of this invention is power conservation in system-on-chip implementations.

BACKGROUND OF THE INVENTION

This invention concerns system-on-chip (SoC) designs. A SoC includes all or substantially all of the electronics of a useful consumer product in a single integrated circuit. Advances in microelectronics enable integration of all electronic components of a system on a single integrated circuit or chip. A SoC generally includes a variety of circuit types such as: a microprocessor based central processing unit (CPU) including a direct memory access (DMA) unit for control of data movement without direct CPU intervention; various peripheral interfaces such as for input devices and output devices; and co-processors designed for specific data processing tasks that cannot be handled by the CPU. The SoC may include memory such as cache memory for the CPU, data buffers within various circuits and non-volatile memory such as read only memory (ROM) or erasable programmable read only memory (EPROM) for program storage for product definition. A SoC may also include larger system memory such as dynamic random access memory (DRAM) or rely upon an external commodity memory integrated circuit.

Due to the variety of circuits required, current SoC designs are often assembled from circuit modules produced by different design teams. Often design of circuit modules is a specialized task and so expertise in one design of one circuit module does not transfer to another circuit module. Even if all the circuit modules are designed by the same design team, often efficiency concerns require that a previously designed circuit module be used as a whole in a new SoC rather than producing a new module design. The task of the SoC design team is primarily in integrating existing circuit modules into the whole. This process is similar to the task of assembling a multi-integrated system from multiple integrated circuits with some important differences.

This design dynamic has given rise to independent module design companies. These companies sole output is called intellectual property (IP) which are circuit module designs. A semiconductor manufacturer purchases this IP for integration into its SoC products. This IP often involves peripherals that cater to a particular application domain such as audio, video, PCI, I2C, etc. These peripherals interact both with the external world and the DMA system to transfer data between them without intervention from the CPU. These IP modules are often delivered to the SoC manufacturer as completed layout designs without the SoC manufacturer having any capability of altering the IP module.

SoC designs are attractive for portable, battery powered systems. It is well known that SoC designs often consume less power than multi-chip designs. This is primarily due to reduction in the need for high-power data drivers between plural integrated circuits. Reduction of power consumption contributes to longer battery life or smaller size due to reduced battery size. With increasing demand for low power applications, run-time power-up/power-down features are required of these IP modules to save power. This would enable an IP module to be powered down when not used and powered up again when used. This should be implemented on a global basis without assuming any power-up/power-down support from the IP module. Many existing IP modules do not include support for selective powering. The SoC designers may not have access to the IP module circuits to add support. In addition, even if the SoC designers could add support for this feature into a module, this may not be an efficient allocation of design resources. Uniformity across the whole SoC requires a global solution.

Implementing such a dynamic power-up/power-down of a module also poses several challenges in a shared and distributed DMA system. On-going transactions might stall because the powered-down module cannot respond. This may reduce the total available DMA bandwidth for remaining active modules. In the worst scenario, it could lead to an entire system hang.

SUMMARY OF THE INVENTION

A system-on-chip integrated circuit selectively gates clocks to individual modules corresponding to the state of a corresponding bit of a peripheral enable register. The clock gating circuit preferably includes an AND gate having a first input the said corresponding clock signal, a second input receiving the peripheral register bit and an output supplying the clock input of the module. This clock gating circuitry preferably also includes additional circuitry to prevent generation of clock glitches.

A reset circuit supplies a signal to a reset input of the digital module for a normal mode if the bit indicates the power-up state and a reset mode if the bit indicates a power-down state. Return to normal mode is delayed a predetermined time after the bit indicates the power-up state to ensure clean power up. The reset circuit may also place the IP module in reset state for a predetermined time before powering down.

A false acknowledge circuit for each module supplies an acknowledge signal in response to a received command if the corresponding bit indicates the power-down state. This prevents system hang cause by non-acknowledgement by the inactive module.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
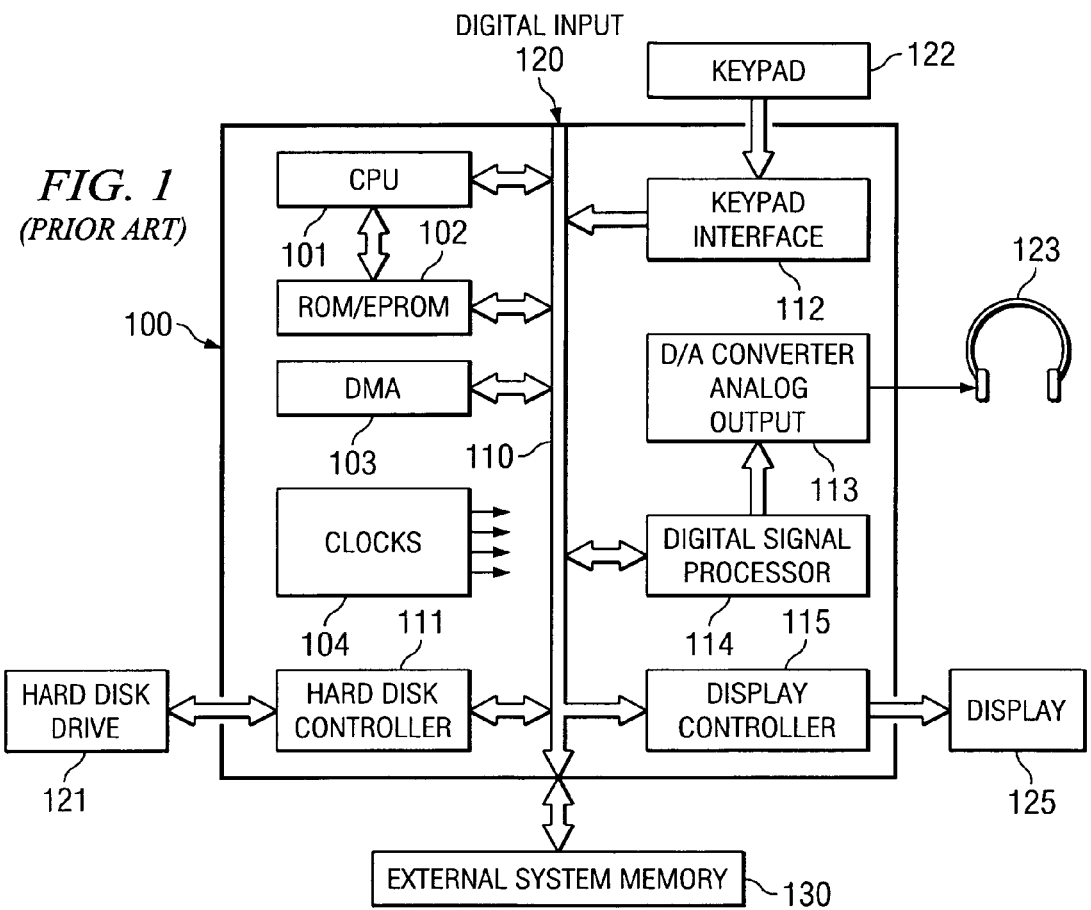
FIG. 1 illustrates a block diagram of an example prior art system-on-chip design implementing a compressed digital music system.

FIG. 1 illustrates a block diagram of a consumer product employing a system-on-chip circuit 100. FIG. 1 illustrates a portable compressed digital music system. This portable compressed digital music system includes system-on-chip integrated circuit 100 and external components hard disk drive 121, keypad 122, headphones 123, display 125 and external memory 130.

The compressed digital music system illustrated in FIG. 1 stores compressed digital music files on hard disk drive 121. These are recalled in proper order, decompressed and presented to the user via headphones 123. System-on-chip 100 includes: core components CPU 101, ROM/EPROM 102, DMA 103 and clocks 104; system bus 110; digital input 120; and peripherals hard disk controller 111, keypad interface 112, D/A converter and analog output 113, digital signal processor 114 and display controller 115. Central processing unit (CPU) 101 acts as the controller of the system giving the system its character. CPU 101 operates according to programs stored in ROM/EPROM 102. Read only memory (ROM) is fixed upon manufacture. Suitable programs in ROM include the user interaction programs, that are how the system responds to inputs from keypad 112 and displays information on display 125, the manner of fetching and controlling files on hard disk drive 121 and the like. Erasable programmable read only memory (EPROM) may be changed following manufacture even in the hand of the consumer in the field. Suitable programs for storage in EPROM include the compressed data decoding routines. As an example, following purchase the consumer may desire to enable the system to be capable of employing compressed digital data formats different from or in addition to the initially enabled formats. The suitable control program is loaded into EPROM from digital input 120 via system bus 110. Thereafter it may be used to decode/decompress the additional data format. A typical system may include both ROM and EPROM.

Direct memory access (DMA) unit 103 controls data movement throughout the whole system. This primarily includes movement of compressed digital music data from hard disk drive 121 to external system memory 130 and to digital signal processor 114. Data movement by DMA 103 is controlled by commands from CPU 101. However, once the commands are transmitted, DMA 103 operates autonomously with intervention by CPU 101.

Clocks 104 generates the clock signals for all portions of the SoC 100. The separate circuits will often require clocks of different frequencies. CPU 101, DMA 102 and digital signal processor 113 will typically require the highest frequency clocks. Hard disk controller 111 will typically require an intermediate frequency clock. Display controller 115 and keypad interface 112 will typically require the lowest frequency clocks.

System bus 110 serves as the backbone of SoC 100. Major data movement within SoC 100 occurs via system bus 110.

Hard drive controller 111 controls data movement to and from hard drive 121. Hard drive controller 111 moves data from hard disk drive 121 to system bus 110 under control of DMA 102. This data movement would enable recall of digital music data from hard drive 121 for decompression and presentation to the user. Hard drive controller 111 moves data from digital input 120 and system bus 110 to hard disk drive 121. This enables loading digital music data from an external source to hard disk drive 121.

Keypad interface 112 mediates user input from keypad 122. Keypad 122 typically includes a plurality of momentary contact key switches for user input. Keypad interface 112 senses the condition of these key switches of keypad 122 and signals CPU 101 of the user input. Keypad interface 112 typically encodes the input key in a code that can be read by CPU 101. Keypad interface 112 may signal a user input by transmitting an interrupt to CPU 101 via an interrupt line (not shown). CPU 101 can then read the input key code and take appropriate action.

Digital to analog (D/A) converter and analog output 112 receives the decompressed digital music data from digital signal processor 114. This provides an analog signal to headphones 123 for listening by the user. Digital signal processor 114 receives the compressed digital music data and decompresses this data. There are several known digital music compression techniques. These typically employ similar algorithms. It is therefore possible that digital signal processor 114 can be programmed to decompress music data according to a selected one of plural compression techniques.

Display controller 115 controls the display shown to the user via display 125. Display controller 115 receives data from CPU 101 via system bus 110 to control the display. Display 125 is typically a multiline liquid crystal display (LCD). This display typically shows the title of the currently playing song. It may also be used to aid in the user specifying playlists and the like.

External system memory 130 provides the major volatile data storage for the system. This may include the machine state as controlled by CPU 101. Typically data is recalled from hard disk drive 121 and buffered in external system memory 130 before decompression by digital signal processor 114. External system memory 130 may also be used to store intermediate results of the decompression. External system memory 130 is typically commodity DRAM or synchronous DRAM.

Figure 2:
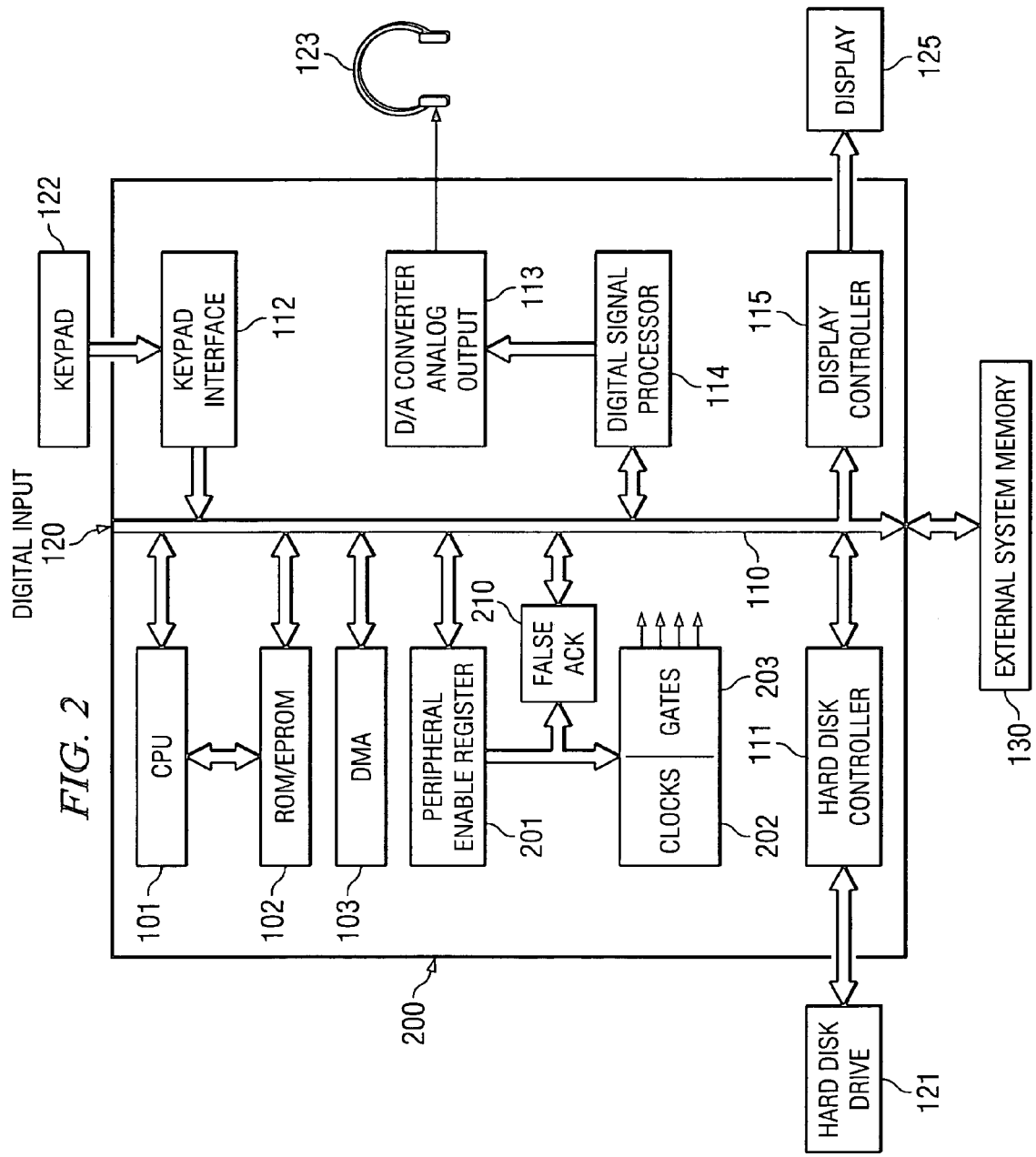
FIG. 2 illustrates a block diagram of an example system-on-chip design according to this invention.

FIG. 2 illustrates the block diagram of SoC 200 constructed according to this invention. SoC 200 includes most of the parts previously included in SoC 100 illustrated in FIG. 1. SoC 200 also includes peripheral enable register 201, clocks 202, gates 203 and false acknowledge unit 210. Peripheral enable (PEREN) register 201 is a memory mapped register readable and writeable via system bus 110. Peripheral enable register 201 has one bit corresponding to each controlled module. These bits associated with the controlled modules control clock gating via gates 203 and generation of acknowledge signals by false acknowledge unit 210.

Figure 3:
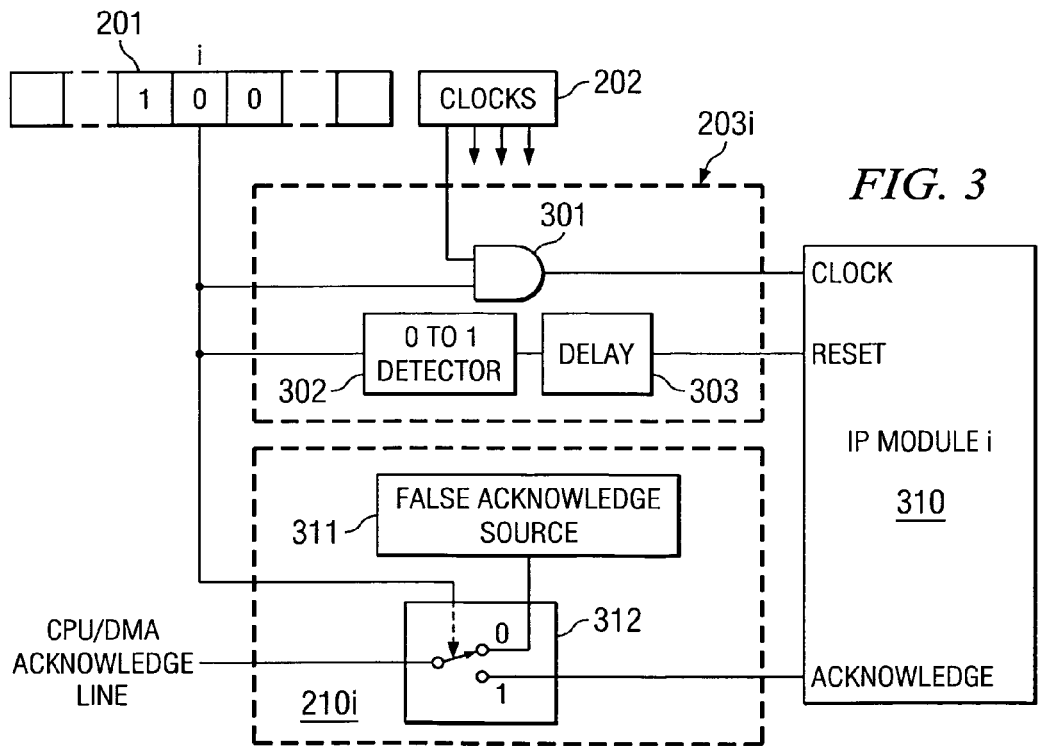
FIG. 3 illustrates a block diagram of a detail of the peripheral enable register and auxiliary hardware illustrated in FIG. 2 implementing this invention.

FIG. 3 illustrates a detailed block diagram of the circuits for control of the i-th IP module 310. This invention circumvents the known problems with the prior art and allows the system to power-down or power-up any IP module as and when the situation demands at run time. PEREN register 201 may be loaded by CPU 101 or by DMA 103 at a suitable memory address. Each bit of PEREN register 201 indicates whether the corresponding IP module is in the powered-up or powered-down mode. Preferably each bit of PEREN register 201 is user writeable/readable.

Gate 203i is responsive to the corresponding i-th bit of PEREN register 201. Gate 203i optionally shuts off the IP module specific clocks via AND gate 301 when corresponding i-th bit in PEREN register 201 indicates the IP module is disabled. In this example, if the i-th bit of PEREN 201 is 0, then AND gate 301 prevents supply of the corresponding clock signal to IP module 310. If the i-th bit of PEREN 201 is 1, then AND gate 301 passes the clock signal to the clock input of IP module 310. It is known in the art that clock gate 203i could include additional synchronization circuits to prevent generation of a clock glitch on switching the clock ON or OFF.

Most integrated circuits are constructed of complementary metal oxide semiconductor (CMOS) circuits. It is known in the art that shutting off the clock to a CMOS circuit substantially reduces the power consumed by that circuit. Thus writing a 0 to a bit of PEREN register 201 reduces the power consumption of the corresponding IP module.

Gate 203i also controls reset of IP module 310. The i-th bit of PEREN register 201 supplies an input to 0 to 1 detector 302. 0 to 1 detector 302 generates a signal when the i-th bit of PEREN register 201 changes from 0 to 1. This signifies that IP module 310 is to resume power-up following power-down. To ensure that IP module 310 starts from a known and deterministic state, the hardware reset input to the peripheral is held for a few cycles before being released at power-up. This delay is set by delay 303 which drives the reset input of IP module 310 following its delay period after 0 to 1 detector 302 is triggered. The length of the delay is selected to insure reliable operation of IP module 310 following this restart. Similar hardware using a 1 to 0 detector (not shown) can be used to place IP module 310 in reset state for a predetermined length of time before switching the clock off via AND gate 301. Such a reset interval would prevent anomalies in IP module 310 upon switching OFF its clock.

FIG. 3 illustrates an example implementation of a false acknowledge for IP module 310. It is typical for IP module 310 to acknowledge commands from a bus master device such as CPU 201 or DMA 203. This acknowledge response enables the bus master device to be assured that the command was received by the target module. To this end, each IP module includes some mechanism to generate an acknowledge response. This is illustrated schematically in FIG. 3 as the Acknowledge I/O of IP module 310. However, those skilled in the art would recognize there are many feasible acknowledge response mechanisms. The bus master would typically go into a recover mode if it fails to receive the expected acknowledge signal. This may involve extensive waits and may cause other processes not directly related to the non-acknowledging IP module to fail.

In this example of the invention, the IP module is not clocked and therefore disabled when the corresponding bit in PEREN register 201 is 0. The IP module cannot generate any acknowledge response in such as state. The false acknowledge of this invention prevents this acknowledge failure from interfering with other unrelated processes. This false acknowledge block is between the IP module and the shared DMA system. False acknowledge source 311 is capable of generating an acknowledge signal in the same manner as the corresponding IP module 310. Switch 312 receives the corresponding bit from PEREN register 201. When this bit indicates that IP module 301 is in power-up state, switch 312 connects the acknowledge I/O of IP module 310 to the acknowledge line of CPU 201 or DMA 203. In this state, IP module 310 is clocked via AND gate 301 and supplies its own acknowledge response. When the corresponding bit indicates that IP module 301 is in power-down state, switch 312 connects false acknowledge source 311 to the acknowledge line of CPU 201 or DMA 203. In this state, IP module 310 is not clocked via AND gate 301 and false acknowledge source 311 supplies a simulated acknowledge response. Thus when IP module 310 is powered-up, false acknowledge source 311 remains passive and switch 312 allows the data-flow between IP module 310 and the DMA system without intervention. When IP module 310 is powered-down, false acknowledge source 311 actively responds back to prevent stalling of any on-going transactions from the just powered-down module. Note at such a stage because CPU 210 or DMA 203 has set the bit in PEREN register 201 to power-down the IP module, transferring the correct data is not of much concern. The prime concern is ensuring no system stall occurs.

This invention is advantageous for the following reasons:

1) This invention does not require any special support from the IP modules for dynamic power management. Most run-time power-up/power-down solutions would require some kind of support from the IP modules. Providing such support can be problematic for purchased IP modules or legacy IP modules.

2) This invention requires no hardware modification to the IP modules in order to support a global power-up/power-down feature.

3) This invention sits seamlessly between the DMA system and the various IP modules and ensures no loss of system performance in terms of DMA bandwidth.

4) In this invention IP module design can be kept much simpler, without bothering about implementing the specifics of a power-up/power-down protocol. Note such a protocol might not be a standard for existing IP modules.

5) A common false acknowledge block can work for all IP modules because the acknowledge protocol is system specific and not IP module specific.

What is claimed is:

1. A system-on-chip integrated circuit comprising:

at least one digital module having a clock signal input, at least one of said at least one digital module including an acknowledge output supplying an acknowledge output in response to a received command;

a clock circuit producing a corresponding clock signal for each of said at least one digital module;

a peripheral enable register having a bit corresponding to each of said at least one digital module, each bit storing either a first digital state indicating a power-up state for the corresponding digital module or a second opposite digital state indicating a power-down state for the corresponding digital module;

a clock gating circuit corresponding to each of said at least one digital module, each clock gating circuit connected to said clock circuit and receiving said corresponding clock signal and connected to said bit of said peripheral enable register, said clock gating circuit supplying said corresponding clock signal to said clock input of said digital module if said corresponding bit of said peripheral enable register indicates said power-up state and not supplying said corresponding clock signal to said clock input of said digital module if said corresponding bit of said peripheral enable register indicates said power-down state; and a false acknowledge circuit corresponding to each digital module supplying an acknowledge output, each false acknowledge circuit receiving said corresponding bit of said peripheral enable register, said false acknowledge circuit supplying an acknowledge signal in response to a received command if said corresponding bit of said peripheral enable register indicates said power-down state and not supplying an acknowledge signal in response to a received command if said corresponding bit of said peripheral enable register indicates said power-up state.

2. The system-on-chip integrated circuit of claim 1 wherein:

said first digital state is 1 and said second digital state is 0; and said clock gating circuit includes an AND gate having a first input receiving said corresponding clock signal, a second input receiving said bit of said peripheral enable register and an output supplying said clock input of said digital module.

3. The system-on-chip integrated circuit of claim 1, wherein:
at least one of said at least one digital module includes a reset input receiving an input signal to place said digital module in a normal mode or a reset mode; and
further comprising a reset circuit corresponding to each of said at least one digital module, each reset circuit connected to said reset input of said digital module and receiving said corresponding bit of said peripheral enable register, said reset circuit supplying a signal to said reset input of said digital module to place said digital module in said normal mode if said corresponding bit of said peripheral enable register indicates said power-up state and to place said digital module in reset mode if said corresponding bit of said peripheral enable register indicates said power-down state.

4. The system-on-chip integrated circuit of claim 3, wherein:
said a reset circuit supplying a signal to said reset input of said digital module to place said digital module in normal mode a predetermined time after said corresponding bit of said peripheral enable register indicates said power-up state.

5. The system-on-chip integrated circuit of claim 4, wherein:
said first digital state is 1 and said second digital state is 0; and
said reset circuit includes
a 0 to 1 detector connected to said corresponding bit of said peripheral enable register generating a signal indicating when said corresponding bit changes from 0 to 1, and
a delay connected to said 0 to 1 detector and supplying said signal to said reset input of said digital module to place said digital module in normal mode for delaying said signal of said 0 to 1 detector said predetermined time.

6. The system-on-chip integrated circuit of claim 1, further comprising:
an acknowledge line for receiving an acknowledge signal corresponding to each digital module; and
said false acknowledge circuit includes
a false acknowledge source capable of generating said acknowledge signal at an acknowledge output in response to said command, and
a switch receiving said bit of said peripheral enable register, said switch having a common connection to said acknowledge line, a first selected connection connected to said acknowledge output of said digital module and a second selected connection connected to said acknowledge output of said false acknowledge source, said switch connecting said common connection to said first selected connection if said corresponding bit of said peripheral enable register indicates said power-up state and connecting said common connection to said second selected connection if said corresponding bit of said peripheral enable register indicates said power-down state.

* * * * *